(12) United States Patent
Hsieh

(10) Patent No.: US 7,390,193 B2
(45) Date of Patent: Jun. 24, 2008

(54) PRINTED CIRCUIT BOARD ASSEMBLY

(75) Inventor: Ming-Chih Hsieh, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,718

(22) Filed: Sep. 15, 2006

(65) Prior Publication Data

US 2007/0197091 A1    Aug. 23, 2007

(30) Foreign Application Priority Data

Feb. 22, 2006    (CN)    .......................... 2006 1 003924

(51) Int. Cl.
*H01R 12/00* (2006.01)
(52) U.S. Cl. ....................................... 439/65
(58) Field of Classification Search ................... 439/65, 439/74, 327, 637, 83, 108, 92, 607
See application file for complete search history.

(56) References Cited

U.S. PATENT DOCUMENTS

| 4,728,305 | A | * | 3/1988 | Seidler | ........................ 439/876 |
| 5,441,429 | A | * | 8/1995 | Seidler | ........................ 439/876 |
| 5,725,389 | A | * | 3/1998 | Scheer | ......................... 439/328 |
| 6,166,457 | A | | 12/2000 | Iguchi et al. | |
| 6,407,930 | B1 | | 6/2002 | Hsu | |

* cited by examiner

*Primary Examiner*—Alexander Gilman
(74) *Attorney, Agent, or Firm*—Wei Te Chung

(57) ABSTRACT

A PCB assembly includes a motherboard, a daughter board, and an elastic strip. The motherboard is electrically connected to the daughter board via connectors. Each of the motherboard and the daughter board includes an area connected to a power layer or a ground layer. One end of the elastic strip electrically connects to the area of the motherboard. The other end of the elastic strip electrically connects to the area of the daughter board whereby increases electrically connection between the motherboard and the daughter board.

3 Claims, 2 Drawing Sheets

PRINTED CIRCUIT BOARD ASSEMBLY

FIELD OF THE INVENTION

The present invention relates to printed circuit board (PCB) assemblies, and more particularly to a PCB assembly for increasing circuits therein.

DESCRIPTION OF RELATED ART

A typical PCB assembly generally includes a motherboard, and a plurality of daughter boards. The daughter boards are removable and electrically connected to the motherboard by connectors. Each of the connectors includes power pins, ground pins, and signal pins for communicating signals.

Typically, when frequencies of electronic components such as central processing units (CPUs) are low, the transmission of signals are not susceptible electromagnetic interference (EMI). However, when the electronic components work at high frequencies, both the power circuit and ground return circuit may be not enough handle the workload, and the transmission of the signals may not be steady because of unsteady power supplies or a poor ground connection. Thus, EMI may have a great influence on other components mounted nearby and even may lead to abnormal operation of the components.

What is desired, therefore, is a PCB assembly for increasing circuits for power and/or ground layers therein.

SUMMARY OF THE INVENTION

In one preferred embodiment, a PCB assembly includes a motherboard, a daughter board, and an elastic strip. The motherboard is electrically connected to the daughter board via connectors. Each of the motherboard and the daughter board includes an area connected to a power layer or a ground layer. One end of the elastic strip electrically connects to the area of the motherboard. The other end of the elastic strip electrically connects to the area of the daughter board whereby increases electrically connection between the motherboard and the daughter board.

Other advantages and novel features will become more apparent from the following detailed description of preferred embodiments when taken in conjunction with the accompanying drawings, in which:

DETAILED DESCRIPTION OF THE INVENTION

Figure 1:
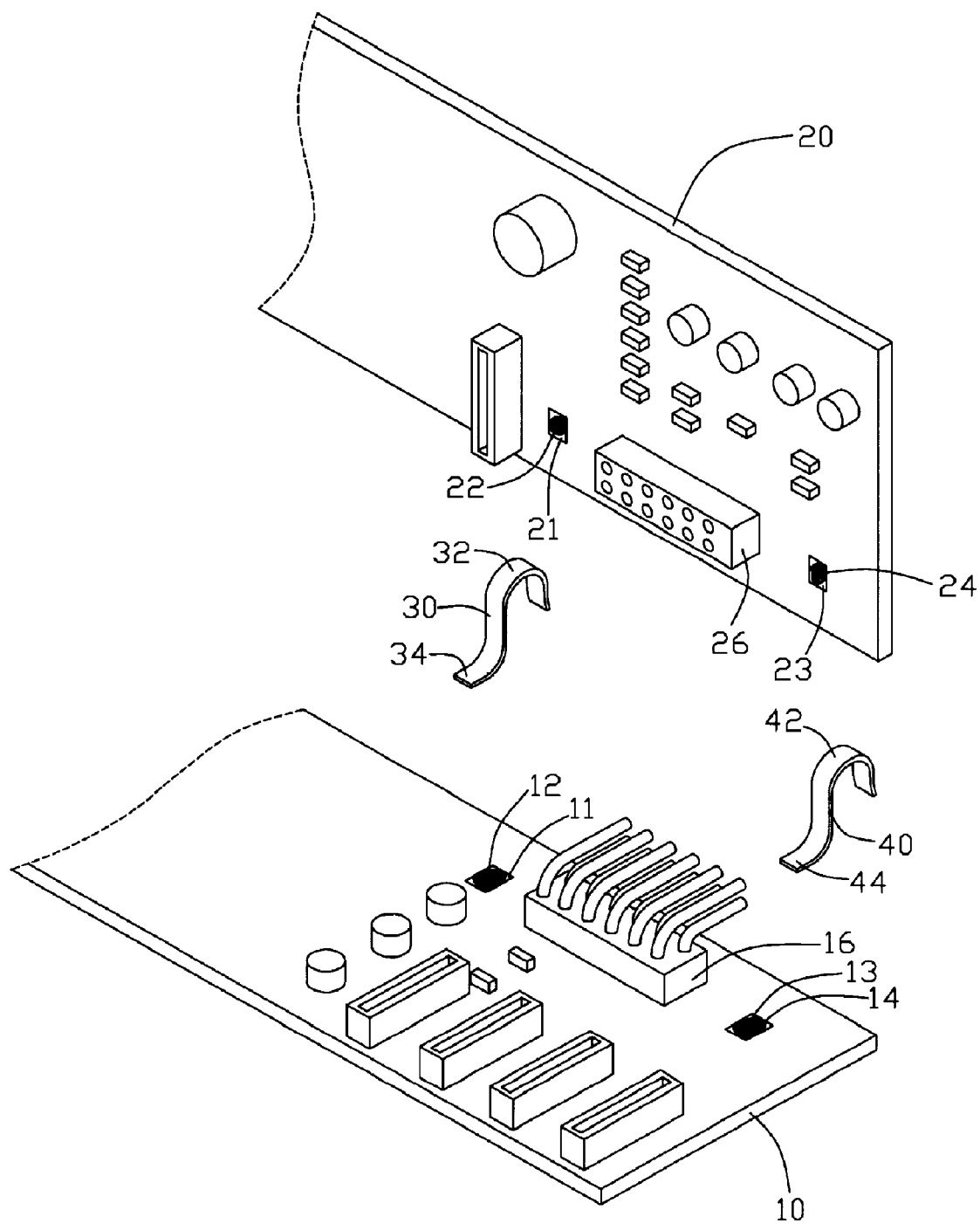
FIG. 1 is an exploded, isometric view of a PCB assembly in accordance with a preferred embodiment of the present invention.

Referring to FIG. 1, a PCB assembly in accordance with a preferred embodiment of the present invention includes a motherboard 10, a daughter board 20, a first elastic strip 30, and a second elastic strip 40.

An area 11 is defined on the motherboard 10. The area 11 is a part of a power layer of the motherboard 10 or electrically connected to the power layer of the motherboard 10. A pad 12 is formed on the area 11. An area 13 is also defined on the motherboard 10. The area 13 is a part of a ground layer of the motherboard 10 or electrically connected to the ground layer of the motherboard 10. A pad 14 is formed on the area 13.

An area 21 is defined on the daughter board 20. The area 21 is a part of a power layer of the daughter board 20 or electrically connected to the power layer of the daughter board 20. A pad 22 is formed on the area 21. An area 23 is also defined on the daughter board 20. The area 23 is a part of a ground layer of the daughter board 20 or electrically connected to the ground layer of the daughter board 20. A pad 24 is formed on the area 23. A connector 26 is formed on the daughter board 20 and electrically connected to the connector 16 of the motherboard 10.

The first elastic strip 30, and the second elastic strip 40 are resilient strips made of good conductive and flexible material. The first elastic strip 30 includes a generally U-shaped resilient portion 32, and a generally J-shaped fixing portion 34. The second elastic strip 40 includes a generally U-shaped resilient portion 42, and a generally J-shaped fixing portion 44.

Figure 2:
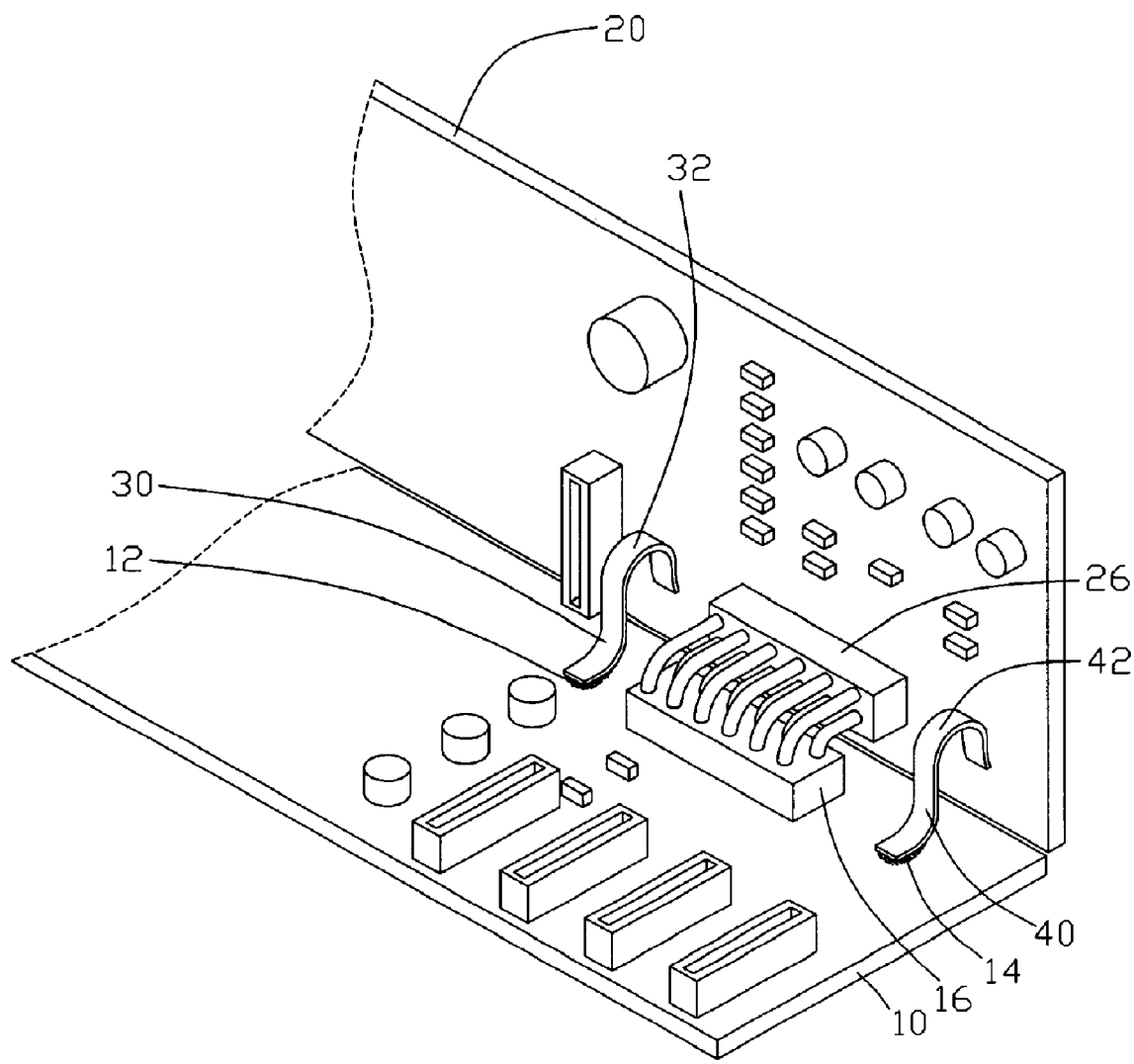
FIG. 2 is an assembled view of FIG. 1.

Referring also to FIG. 2, in assembly, the connector 16 of the motherboard 10 is coupled to the connector 26 of the daughter board 20. The fixing portion 34 of the first elastic strip 30 is attached to and electrically connected with the pad 12 of the motherboard 10. In this embodiment, the fixing portion 34 of the first elastic strip 30 is soldered to the pad 12 of the motherboard 10. The resilient portion 32 of the first elastic strip 30 resiliently abuts against the pad 22 of the daughter board 20. The fixing portion 44 of the second elastic strip 40 is attached to and electrically connected with the pad 14 of the motherboard 10. In this embodiment, the fixing portion 44 of the second elastic strip 40 is soldered to the pad 14 of the motherboard 10. The resilient portion 42 of the second elastic strip 40 resiliently abuts against the pad 24 of the daughter board 20. The use of the first elastic strip 30, the second elastic strip 40, and the corresponding pads expand connecting areas for the power layers, and the ground plates between the motherboard 10, and the daughter board 20. Therefore, power supplies and ground connections of the PCB assembly are both stable even when frequencies of electronic components are high. The EMI of the components is reduced as well. According to actual needs, numbers of the first elastic strip 30, and the second elastic strip 40 may be changed. In the preferred embodiment, the fixing portions 34, 44 may be electrically connected with the pads 22, 24 of the daughter board 20 respectively, and the resilient portion 32, 42 resiliently abut against the pads 12, 14 of the motherboard 10 respectively. It is to be noted that in the case where the ends of the resilient strips 30, 40 abut the motherboard/daughter board, pads and soldering may be omitted.

In other preferred embodiments of the present invention, only one kind of the areas are formed on the motherboard, and the daughter board respectively. Thus, one elastic strip is used to connect the areas.

It is to be understood, however, that even though numerous characteristics and advantages of the preferred embodiments have been set forth in the foregoing description, together with details of the structures and functions of the embodiments, the disclosure is illustrative only, and changes may be made in detail, especially in matters of shape, size, equivalent material and arrangement of parts within the principles of the invention to the full extent indicated by the broad general meaning of the terms in which the appended claims are expressed.

What is claimed is:

1. A printed circuit board assembly comprising:
   a motherboard comprising an area connected to a power layer thereof;
   a daughter board electrically connected to the motherboard via connectors, the daughter board comprising an area connected to a power layer thereof; and at least two elastic strips, each with one end engaged with the area of the motherboard along a first direction to electrically connected to the area of the motherboard, and the other end engaged with the area of the daughter board along a second direction perpendicular to the first direction to electrically connect to the area of the daughter board, the one end and the other end being connected with a curvilinear intermediate section, wherein the connectors being disposed between said at least two elastic strips.

2. A printed circuit board assembly comprising:

a motherboard comprising an area connected to a ground layer thereof;

a daughter board electrically connected to the motherboard via connectors, the daughter board comprising an area connected to a ground layer thereof; and at least two elastic strips, each with one end engaged with the area of the motherboard along a first direction to electrically connected to the area of the motherboard, and the other end engaged with the area of the daughter board along a second direction perpendicular to the first direction to electrically connect to the area of the daughter board, the one end and the other end being connected with a curvilinear intermediate section, wherein the connectors being disposed between said at least two elastic strips.

3. A printed circuit board assembly comprising:

a motherboard comprising a power layer and a ground layer;

a daughter board electrically connected to the motherboard via connectors formed between the motherboard and the daughter board, the daughter board comprising a power layer and a ground layer; and at least two metal strips, each electrically connecting one of the power layer and the ground layer of the motherboard with a corresponding one of the power layer and the ground layer of the daughter board wherein the each metal strip has a U-shaped portion extending only at a side of one of the motherboard and the daughter board facing the other one of the motherboard and the daughter board in order to normally engage with the side of the one of the motherboard and the daughter board, and a J-shaped portion extending from the U-shaped portion and extending only at a side of the other one of the motherboard and the daughter board facing the one of the motherboard and the daughter board in order to normally engage with the side of the other one of the motherboard and the daughter board, wherein the connectors being disposed between said at least two elastic strips.

* * * * *